United States Patent
Watanabe

(12)
(10) Patent No.: US 6,505,876 B1
(45) Date of Patent: Jan. 14, 2003

(54) STRUCTURE FOR WIRING CIRCUITS ON PANEL

(75) Inventor: Hiroshi Watanabe, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/449,554

(22) Filed: Nov. 29, 1999

(30) Foreign Application Priority Data

Nov. 30, 1998 (JP) ........................................... 10-339724
Mar. 17, 1999 (JP) ........................................... 11-071859

(51) Int. Cl.⁷ ............................................. B62D 25/14
(52) U.S. Cl. ........................................ 296/70; 296/208
(58) Field of Search .................... 296/70, 208; 439/34, 439/77, 296, 297

(56) References Cited

U.S. PATENT DOCUMENTS

| | | | |
|---|---|---|---|
| 3,417,362 A | * | 12/1968 | Reynolds |
| 4,570,031 A | * | 2/1986 | Inoue |
| 5,353,190 A | * | 10/1994 | Nakayama et al. |
| 5,484,186 A | * | 1/1996 | Van Order et al. |
| 5,712,764 A | * | 1/1998 | Baker et al. |
| 5,883,777 A | * | 3/1999 | Nishitani et al. |
| 5,993,247 A | * | 11/1999 | Kidd |
| 6,048,020 A | * | 4/2000 | Gronowicz et al. |
| 6,095,272 A | * | 8/2000 | Takiguchi et al. |
| 6,107,929 A | * | 8/2000 | Amari |
| 6,126,459 A | * | 10/2000 | Reddy et al. |
| 2002/0011136 A1 | * | 1/2002 | Eggert et al. |

FOREIGN PATENT DOCUMENTS

JP          9-19035          1/1997

* cited by examiner

*Primary Examiner*—D. Glenn Dayoan
*Assistant Examiner*—Scott Carpenter
(74) *Attorney, Agent, or Firm*—Armstrong, Westerman & Hattori, LLP

(57) ABSTRACT

A structure for wiring circuits on a panel of a vehicle body, consists of a panel board separate from the panel of the vehicle body, which has conductors laid in a desired wiring pattern for constituting the circuits; and a receiver space provided in the panel of the vehicle body for receiving the panel board, wherein the panel board is mounted in the receiver space to wire the circuits on the panel of the vehicle body. Preferably, the conductors are at least partially exposed for electric connection to an auxiliary to be mounted on the panel of the vehicle body. The structure enables an easy wiring of circuits and gives an improved configuration flexibility for the panel, reliably retains circuit-constituting conductors, provides an improved workability, and is better adapted for connecting to an auxiliary.

3 Claims, 8 Drawing Sheets

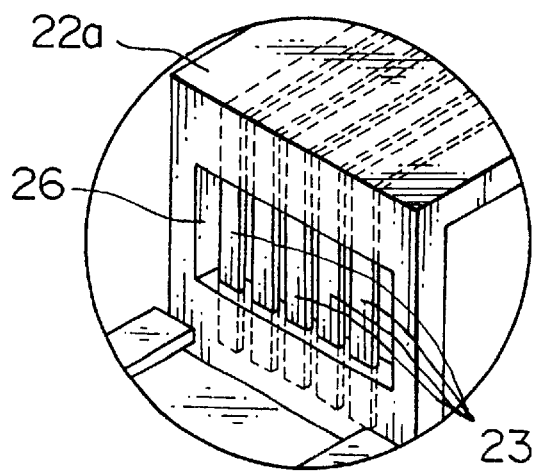
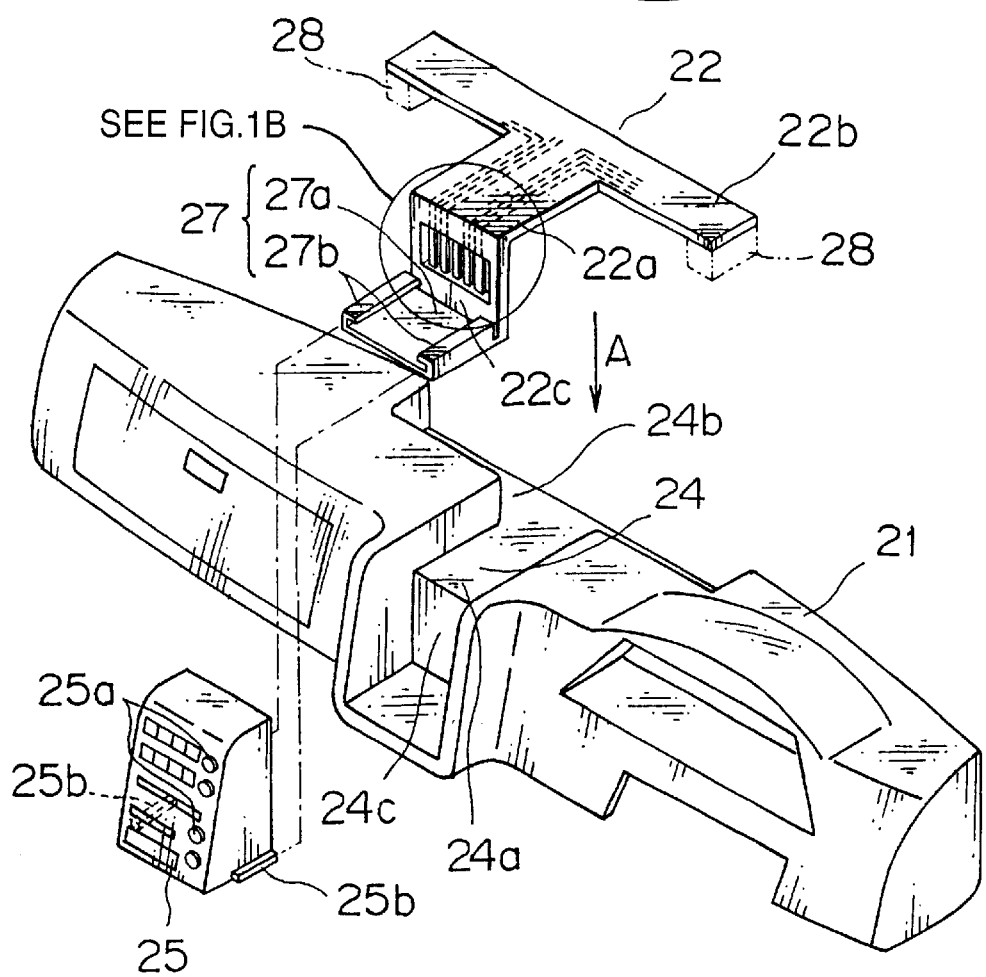
FIG. 1B
FIG. 1A

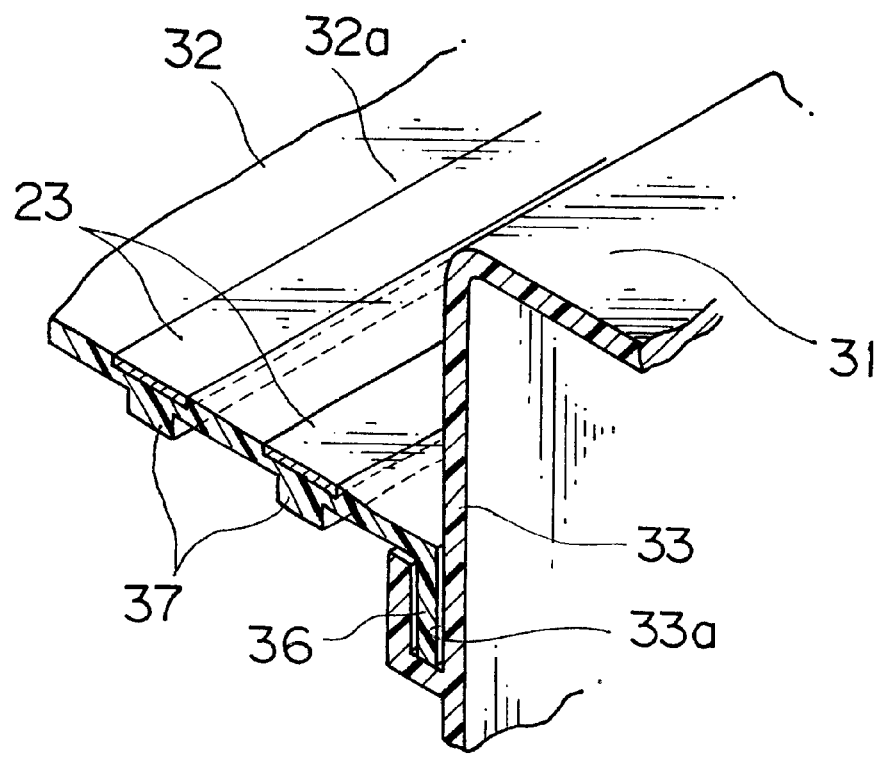
F I G. 5
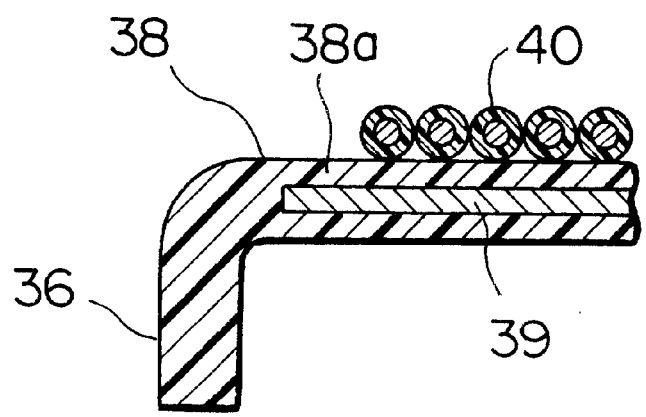
F I G. 6

US 6,505,876 B1

STRUCTURE FOR WIRING CIRCUITS ON PANEL

BACKGROUND OF THE INVENTION

1. Field of the Invention

This invention relates to a structure for wiring one or more circuits on a panel of a vehicle body.

2. Description of the Related Art

Circuit-wiring structures of this type have been proposed in Japanese Patent Application Unexamined Publication No. 9-19035, which are shown in FIGS. 10 and 11.

In FIG. 10, a round wiring harness 1 having insulated conductors wound around by a tape is pushed in a guide lane 4 formed in an inner harness attachment surface 3 of an instrument panel 2 of a vehicle. Resilient locking claws 5, 5 integral with and projecting inwardly at the edges of the guide lane 4 are deflected inwardly to allow the insertion of the wiring harness 1 into the guide lane 4.

The width W1 between the locking claws 5, 5, as shown in FIG. 10, is smaller than the inner width W2 of the guide lane 4, and the length L1 of the locking claws 5 is about ¼ of the inner width W2 of the guide lane 4.

Referring to FIG. 11, a flat wiring harness 7 is pushed in a shallow concave guide lane 8 formed in the harness attachment surface 3. Locking claws 9, 9 are provided integrally at the edges of the guide lane 8 to project inwardly, nd the flat wiring harness 7 is deflected to be inserted into the guide lane 8.

The inner width W3 between the locking claws 9, 9, as shown in FIG. 11, is smaller than the inner width W4 of the guide lane 8, and the length L2 of the locking claws 9 is about ¼ of the inner width W4 of the guide lane 8.

In recent years, the number of auxiliaries placed on board a vehicle such as an automobile has been increasing, which inevitably requires an increasing number of circuits for connecting the auxiliaries to a power source, constituted by for example the round wiring harnesses 1 or flat wiring harnesses 7 as mentioned above. As a result, there are lots of wiring harnesses wired in the vehicle including the inside of the instrument panel 2.

Under these conditions, in order to efficiently wire circuits on a panel of a vehicle body such as the instrument panel 2, it is necessary at the initial design stage to plot for the wiring harnesses.

With such conventional circuit-wiring structures as mentioned above, however, because the holding means for the wiring harnesses are provided on the panel of the vehicle body and undercuts are formed by the locking claws 5, 9, if the panel of the vehicle has a complicated configuration, due to the limited direction of removing the molding die, a satisfactory plotting for the wiring harnesses cannot be made, resulting in the configuration flexibility of the panel impaired.

Further, a complex molding die will be required. In addition, due to the undercut formed during the molding by the locking claws 5, 6, it will be difficult to provide the inner width of the guide lane 4, 8 as designed, with the result that the wiring harness actually is not properly retained.

With such conventional circuit-wiring structures, because the wiring harnesses 1, 7 are fitted in the respective guide lanes 4, 8 one by one, the laying operation is time-consuming, resulting in a low workability.

With such conventional circuit-wiring structures, because the wired harness is connected to the related auxiliary through connectors, one attached to a branch from the wired harness and the other attached to the auxiliary, there are cases in which the connectors are coupled by hand in a blind manner inside for example the instrument panel 2.

Such conventional circuit-wiring structures thus require much labor and time during the stage of laying the wiring harnesses and the subsequent stages.

SUMMARY OF THE INVENTION

This invention has been accomplished to overcome the above drawbacks and an object of this invention is to provide a structure for wiring circuits on a panel of a vehicle body which enables an easy wiring of circuits and gives an improved configuration flexibility for the panel, which reliably retains circuit-constituting conductors, which provides an improved workability, and which is better adapted for connecting to an auxiliary.

In order to attain the object, according to this invention, there is provided a structure for wiring one or more circuits on a panel of a vehicle body, which comprises: a panel board separate from the panel of the vehicle body, which has one or more conductors laid in a desired wiring pattern for constituting the one or more circuits; and a receiver space provided in the panel of the vehicle body for receiving the panel board, wherein the panel board is mounted in the receiver space to wire the one or more circuits on the panel of the vehicle body.

Preferably, the one or more conductors are at least partly exposed for electric connection to an auxiliary to be mounted on the panel of the vehicle body.

Preferably, the one or more conductors are embedded in the panel board by insert molding, and the panel board has at least one window whereat the one or more conductors are exposed for electric connection to the auxiliary.

Preferably, the one or more conductors are provided in a flat harness on the panel board, with at least one portion thereof exposed for electric connection to the auxiliary.

Advantageously, the panel board is provided at opposite sides thereof with a pair of guide pieces extending in a fitting direction of the panel board in the receiver space, and the panel is provided inside the receiver space with a pair of corresponding guide grooves for fitting engagement therein of the guide pieces.

Advantageously, the panel board further has a rib extending longitudinally of the panel board for improving its stiffness.

Advantageously, the panel board further has a plate adhered to or embedded in the panel board for improving its stiffness.

Advantageously, the auxiliary comprises an internal unit including a substrate and at least one electric or electronic component implemented on the substrate, and wherein the panel board has the internal unit assembled and electrically connected thereto in advance and is mounted, along with the internal unit, in the panel as of the vehicle body.

Advantageously, the panel board further has a means for mounting the auxiliary thereon.

Advantageously, the panel of the vehicle has a reinforcement member therefor, and the panel board is fixed to the reinforcement member to be mounted in the receiver space provided in the panel of the vehicle.

Preferably, the panel board comprises a first substrate portion extending longitudinally of the vehicle body, a second substrate portion provided at one end of the first substrate portion which has a connector leading to the one or more conductors, a third substrate portion extending downwardly at an opposite end of the first substrate portion, and an auxiliary-guiding and -fixing portion extending longitudinally at a lower end of the third substrate portion, and wherein at least one of the first and third substrate portions and the guiding and fixing portion has a window whereat the one or more conductors are exposed for electric connection to an auxiliary to be mounted on the panel of the vehicle.

The above and other objects, features and advantages of this invention will become apparent from the following description and the appended claims, taken in conjunction with the accompanying drawings.

BRIEF DESCRIPTION OF THE DRAWINGS

FIG. 1 is a perspective view of a structure for wiring circuits on a panel according to one embodiment of this invention, with an encircled enlarged partial view of a panel board;

FIG. 5 is a partial sectional view of the panel board of FIG. 4, taken transversely to a longitudinal direction of the panel board;

FIG. 6 is a partial sectional view of yet another example of a panel board, taken transversely to a longitudinal direction of the panel board;

DESCRIPTION OF THE PREFERRED EMBODIMENTS

Embodiments of this invention will now be described with reference to the attached drawings.

Figure 2:
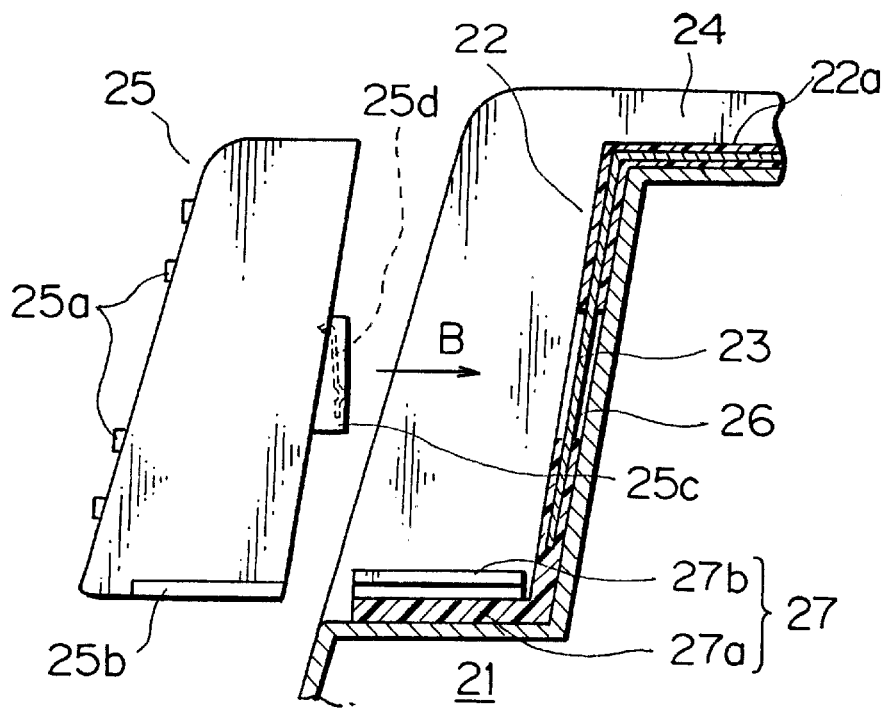
FIG. 2 is a longitudinal sectional view of the structure in FIG. 1.

FIG. 1 is a perspective view of one embodiment of a structure for wiring circuits on a panel according to this invention. FIG. 2 is a longitudinal sectional view of the structure of FIG. 1.

In FIG. 1, denoted 21 is a synthetic-resin made instrument panel of a vehicle, and 22 is a panel board also of synthetic resin which has embedded therein by insert molding a plurality of busbars 23 as circuit-constituting conductors. The panels of a vehicle to which this invention is applicable are not limited to instrument panels, but include other panels such as a door trim panel.

According to the circuit wiring structure of this invention, circuits are wired on the instrument panel 21 by mounting a panel board 22 in a receiver space 24 of the instrument panel 21, which panel board 22 is separate from the instrument panel 21 and carries the circuit-constituting busbars 23.

Incidentally, after the panel board 22 has been mounted, a not-shown cover and a later-described auxiliary 25 are fitted at the receiver space 24 to provide a normal appearance as an instrument panel.

The instrument panel 21 is a panel of synthetic resin molded by a large injection molding machine and has a substantially T-shaped receiver space 24 formed in the upper surface for receiving the panelboard 22 (not limited to this configuration, though). The receiver space 24 includes a first portion 24a extending longitudinally of a not-shown vehicle, a second portion 24b at one end of the first portion 24a which extends perpendicularly to the vehicle longitudinal direction, and a third portion 24c at the other end of the first portion 24a which extends downwardly on the drawing FIG. 1.

The panel board 22 consists of a substantially T-shaped substrate of synthetic resin corresponding in shape to the receiver space 24 and the busbars 23 of conductive metal integrally embedded in the substrate in a desired wiring pattern, and includes a first longitudinally-extending substrate portion 22a, a second substrate portion 22b extending perpendicularly at one end of the first substrate portion 22a, and a third substrate portion 22c extending downwardly at the other end of the first substrate portion 22a, the first, second and third substrate portions 22a, 22b and 22c being received in the respective first, second and third portions 24a, 24b and 24c of the receiver space 24. The third substrate portion 22c has a conductor exposure window 26 whereat the busbars 23 are exposed for contact with an auxiliary 25 and an integral guiding and fixing portion 27 for the auxiliary 25. The second substrate portion 22b is provided at opposite ends with connectors 28, 28 for supplying power to the busbars 23 and the like. (The connectors 28, 28 may be provided in card edge form or the like.)

The busbars 23, as shown in a circle of FIG. 1, are embedded in the panel board 22 at a substantially intermediate width thereof by insert molding and also serve to reinforce the panel board 22 against distortion.

The conductor exposure window 26, as shown in the circle of FIG. 1, is of rectangular shape and cut through the third substrate portion 22c to have the busbars 23 exposed for direct contact and electrical connection with the auxiliary 25. The window 26, although cut through the substrate portion 22c in the example of FIG. 1, may alternatively be provided in a mere depression in which the conductors 23 are exposed only at the surface toward the auxiliary 25, so as to improve the stiffness of the substrate portion 22c.

The auxiliary-guiding and -fixing portion 27 consists of a mount plate 27a protruding at the lower end of the third substrate portion 22c toward the auxiliary 25 and guides 27b, 27b of L-shaped cross section provided at opposite sides of the mount plate 27a. The auxiliary 25 is guided along the guides 27b, 27b to slide on the mount plate 27a.

The auxiliary 25, as shown in FIGS. 1 and 2, is implemented with various switches 25a and is formed on opposite side surfaces with rails 25b, 25b of rectangular cross section which are guided in the respective guides 27b, 27b.

The auxiliary 25, as shown in FIG. 2, has an integral connector 25c on its rear surface for connecting to the busbars 23. The connector 25c has the number of resilient contact pieces 25d corresponding to that of the busbars 23, which resiliently contact with the respective busbars 23 as the auxiliary 25 is pushed against the conductor exposure window 26, so that the busbars 23 electrically connect to a not-shown internal unit of the auxiliary 25.

The process of assembling the auxiliary 25 to the instrument panel 21 will now be described with reference to FIGS. 1 and 2.

In FIG. 1, the panel board 22 is first moved in the direction of an arrow A and fitted in the receiver space 24. The panel board 22 is provided on its rear surface with a not-shown adhesive tape or the like and fixed in position with same.

After the panel board 22 has been mounted, as shown in FIG. 2, the auxiliary 25 is moved in the direction of an arrow B. The auxiliary 25 is guided along the auxiliary-guiding and -fixing portion 27 until its connector 25c comes into contact with the busbars 23 in the window 26, at which time the auxiliary 25 is fixed in that position.

Thus, as described with reference to FIGS. 1 and 2, in the circuit-wiring structure, the plurality of busbars 23 are first embedded in a desired wiring pattern in the panel board 22, which is separate from the instrument panel 21, and then the panel board 22 is mounted on the instrument panel 21 to have the busbars wired thereon.

Due to the above, the configuration flexibility in designing a panel of a vehicle body such as the instrument panel is not limited by the circuits to be wired on the panel. In other words, because the panel is free of holding means for the circuits themselves such as circuit-receiving grooves and locking claws, even in the case where the panel increases in complexity and is installed with lots of circuits, a relatively larger configuration flexibility of the panel can be obtained.

Further, because the panel board 22 has the guiding and fixing portion 27 for the auxiliary 25, there is no need for the panel itself to be provided with a geometrical feature for holding the auxiliary 25, also leading to an improved configuration flexibility of the panel.

Because the panel board 22, which has the busbars 23 embedded therein by insert molding, is installed to wire the circuits on the panel of the vehicle body, a secure retention of the circuit constituting busbars 23 is attained, and because it is not necessary to undergo the troublesome work of fitting wiring harnesses in position one by one as in the described related art, an improved workability is attained.

The conductor exposure window 26 makes it easy to connect the auxiliary 25, also leading to an improved workability.

Further, because the connection to the auxiliary is made without recourse to a branch from the mains, a reduction in the cost is also attained.

Thus, a structure is provided which enables an easy wiring of circuits on a panel of a vehicle body and gives an improved configuration flexibility for the panel, which reliably retains circuit-constituting conductors, and which leads to an improved workability.

Another example of a panel board will now be described with reference to FIG. 3.

Figure 3:
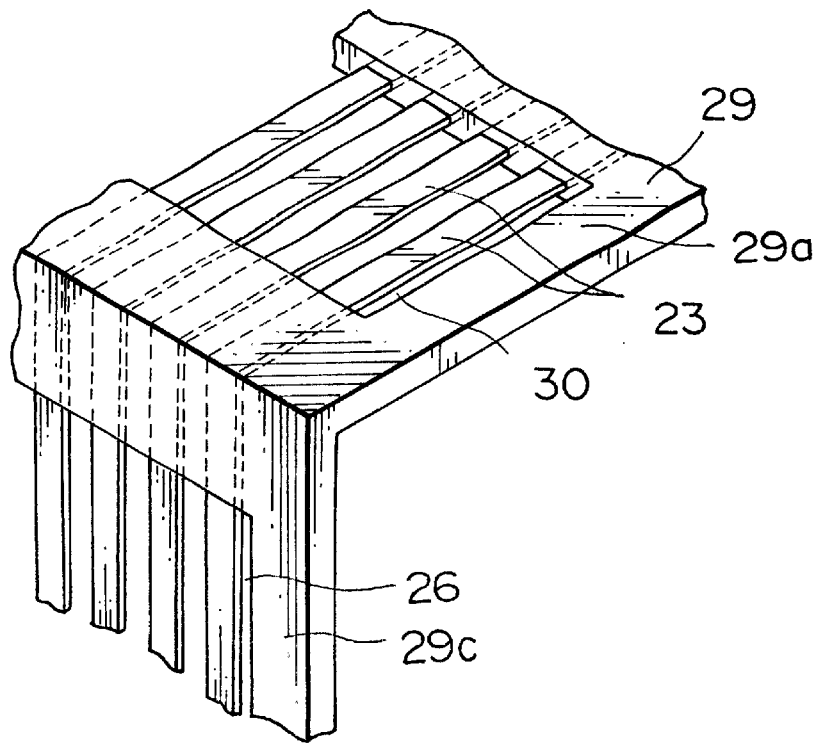
FIG. 3 is a perspective partial view of another example of a panel board according to this invention.

The panel board 29 in FIG. 3 has a conductor exposure window 30 formed in its first substrate portion 29a, in addition to that formed in the third substrate portion 29c. This arrangement enables the above-referenced auxiliary 25 and an additional auxiliary (not shown) to directly connect to the busbars 23, or a large auxiliary (not shown) to connect to the busbars 23 with the electrical contact made at both the windows 26, 30 in the first and third substrate portions 29a, 29c, thus adapting for a variation of an auxiliary.

Yet another example of a panel board will now be described with reference to FIG. 4.

Figure 4B:
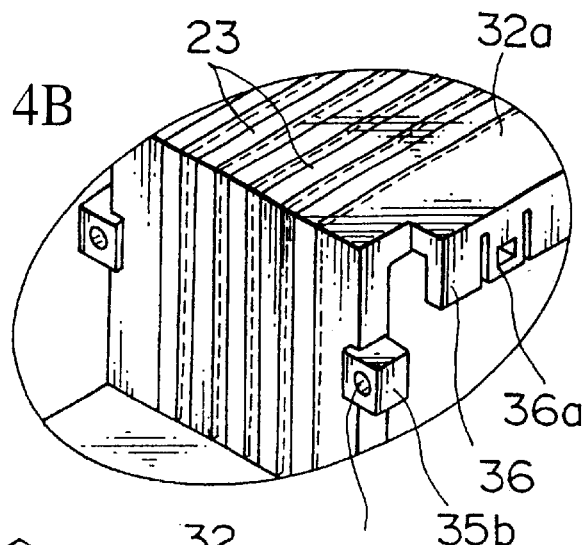
FIG. 4 is a perspective view similar to FIG. 1, showing yet another example of a panel board, with an encircled enlarged partial view of the panel board.
Figure 4A:
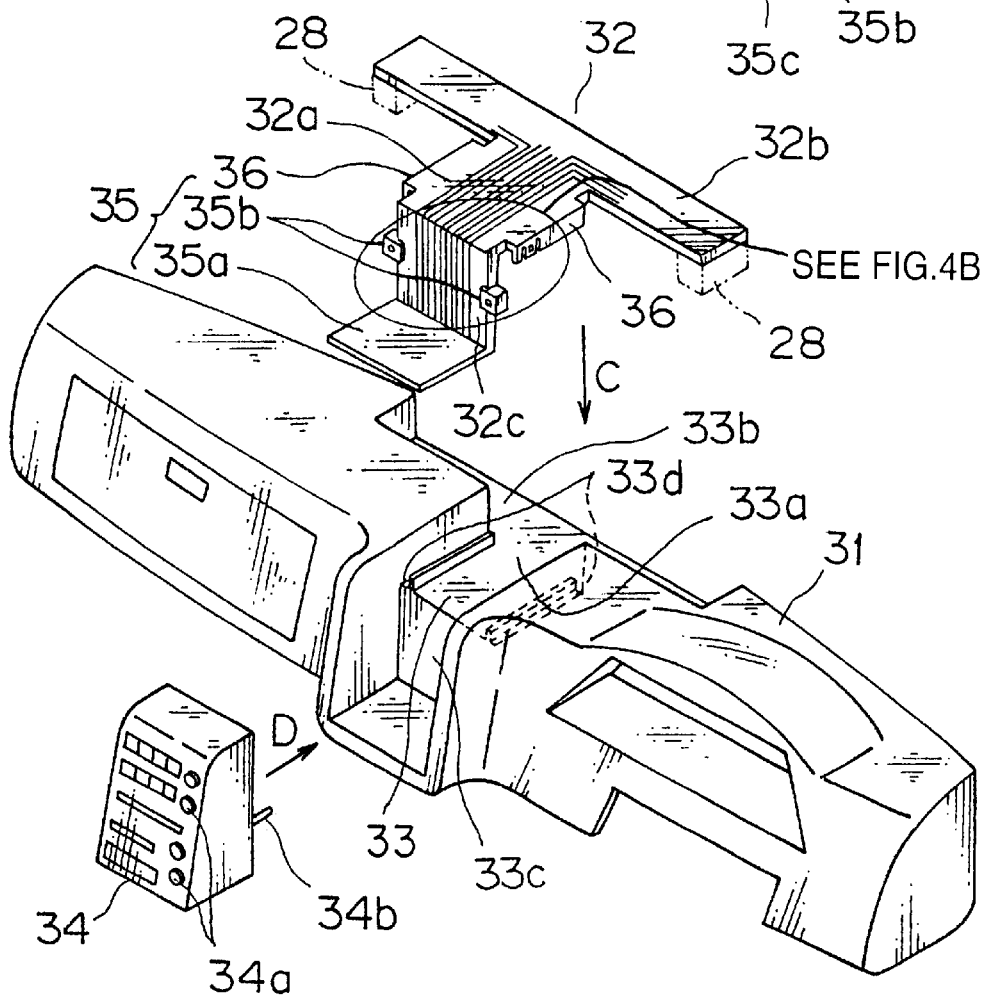

The instrument panel 31 in FIG. 4, like the instrument panel 1 in FIG. 1, is a panel of synthetic resin molded by a large injection molding machine and has a substantially T-shaped receiver space 33 formed in the upper surface for receiving a panel board 32. The receiver space 33 includes a first portion 33a extending longitudinally of a not-shown vehicle, a second portion 33b at one end of the first portion 33a which extends perpendicularly to the vehicle longitudinal direction, and a third portion 33c at the other end of the first portion 33a which extends downwardly on the drawing FIG. 4. Guide grooves 33d, 33d are formed to extend longitudinally at opposite sides of the first portion 33a.

The panel board 32 consists of a substantially T-shaped substrate of synthetic resin corresponding in shape to the receiver space 33 and includes a first longitudinally-extending substrate portion 32a, a second substrate portion 32b extending perpendicularly at one end of the first substrate portion 32a, and a third substrate portion 32c extending downwardly at the other end of the first substrate portion 32a, the first, second and third substrate portions 32a, 32b and 32c being received in the respective first, second and third portions 33a, 33b and 33c of the receiver space 33. The plurality of busbars 23 of conductive metal are laid in a desired wiring patter, integrally or in a fitted manner on the panel board 32.

The third substrate portion 32c has an integral guiding and fixing portion 35 for an auxiliary 34.

The first substrate portion 32a has at its opposite sides guide pieces 36, 36 which extend in a fitting direction of the panel board 32 (in the direction of an arrow C). The guide pieces 36, 36 has respective locking pieces 36a, 36a (only one is shown) engageable with not-shown locking claws provided in the guide grooves 33d, 33d.

The panel board 32, as shown in FIG. 5, has a plurality of reinforcement ribs 37 extending longitudinally on the underside of its first and third substrate portions 32a, 32c for preventing distortion of the panel board 32. The reinforcement ribs 37 may have other form insofar as capable of serving the above purpose and may extend in a width direction of the panel board 32.

The second substrate portion 32b is provided at opposite ends with connectors 28, 28 for supplying power to the busbars 23 and the like.

The plurality of busbars 23, as shown in a circle of FIG. 4, have one surface thereof flush with the surface of the first and third substrate portions 32a, 32c and also serve, like the reinforcement ribs 37, to prevent distortion of the panel board 32.

The auxiliary-guiding and -fixing portion 35 consists of a mount plate 35a projecting at the lower end of the third substrate portion 32c toward the auxiliary 34 and a pair of auxiliary-locking elements 35b, 35b provided at opposite sides of the third substrate portion 32c, each locking element having a locking throughhole 35c extending in a fitting direction of the auxiliary 34 (in the direction of an arrow D) The auxiliary 34 is slidable on the mount plate 35a.

The auxiliary 34, as shown in FIG. 4, is implemented with various switches 34a and has, on the rear surface facing the busbars 23, a not-shown integral connector similar to the connector 25c as in FIG. 2 and pin members 34b, 34b (only one is shown) for engagement in the respective locking throughholes 35c, 35c.

The process of assembling the auxiliary 34 to the instrument panel 31 will now be described with reference to FIGS. 4 and 5.

In FIG. 4, the panel board 32 is first moved in the direction of the arrow C and fitted in the receiver space 33, at which time the guide pieces 36, 36 engage in the respective guide grooves 33d, 33d to lock the panel board 32 in the receiver space 33. The auxiliary 34 is then moved in the direction of an arrow D and fitted, with its pin members 34b, 34b pressed into the respective locking throughholes 35c, 35c, so as to bring resilient contact pieces (not shown) of the not-shown connector into contact with the respective busbars 23. The auxiliary 34 is thus electrically connected and mounted at the same time.

The above circuit-wiring structure has, besides the same advantages as obtained with the previously-described panel board 22, the following additional advantages.

In other words, because the guide pieces 36 are provided at opposite sides of the first substrate portion 32a to extend vertically in the fitting direction C of the panel board 32 and the corresponding guide grooves 33d are provided at opposite sides in the receiver space 33, through their vertical engagement with each other, the panel board 32 can be easily fitted and locked in position, thereby leading to an improved workability.

Because the receiver space 33 is defined by vertical walls extending in the same direction as the guide pieces 36 and as the removing direction of a die for molding the instrument panel 21, an improvement is made both in workability of mounting the panel board 32 and in the configuration flexibility as referred to above.

Further, because the panel board 32 is provided with the reinforcement ribs 37 to improve its stiffness, it becomes possible to suppress distortion of the panel board 32, with the result that the circuit-constituting conductors such as the busbars 23 are held in position in a stable manner on the panel board 32. Such positional stability of the conductors leads to a reliable connection of the conductors to the auxiliary 34. Yet another example of a panel board will now be described with reference to FIG. 6.

FIG. 6 is a sectional view of a panel board 38 taken transversely to its longitudinal direction.

The first substrate portion 38a of the panel board 38 has the guide pieces 36 as in the preceding example and has a metallic reinforcement plate 39 as of iron embedded therein to improve the stiffness of the panel board 38. (The reinforcement plate may alternatively be adhered to the underside of the panel board 38). The panel board 38 has a flat wiring harness 40 adhered to its upper surface with a suitable fixing means such as an adhesive, adhesive sheet or the like.

With such panel board 38, the same advantages are obtainable as those obtained with the panel board 32 as described above.

Description will now be made of a further example of a panel board with reference to FIG. 7 in which parts or elements similar to those of the panel board 22 as in FIGS. 1 and 2 are denoted by similar reference characters.

Figure 7:
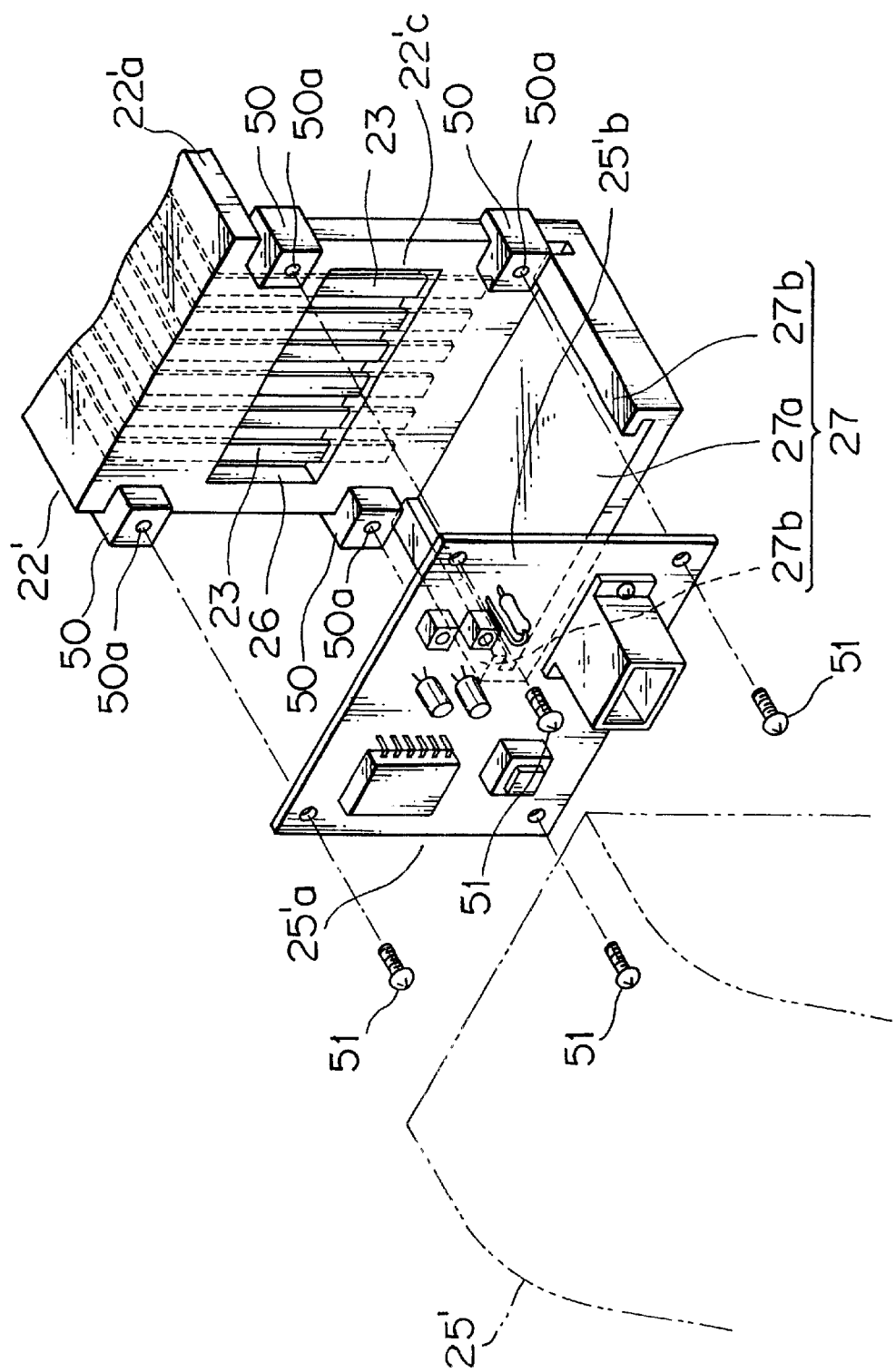
FIG. 7 is a perspective view of a further example of a panel board according to this invention.

In FIG. 7, a panel board 22' differs from the panel board 22 in that its third substrate portion 22'c is provided at four corners thereof with integral locking elements 50 through which an internal unit 25'a of an auxiliary 25' is fixed to the third substrate portion 22'c. The panel board 22', with the internal unit 25'a of the auxiliary 25' alone fixed in advance to its third substrate portion 22'c, is mounted in the receiver space 24 (FIG. 8) of the instrument panel 21. Each locking element 50 is formed with a hole 50a to receive a screw 51 to fix the internal unit 25'a, although other known means are employable as needed for that purpose. Likewise, the positions of the locking elements 50 are not limited to the four corners of the third substrate portion 22'c.

The panel board 22', like the panel board 22, consists of a substrate of synthetic resin and the plurality of busbars 23 of conductive metal integrally embedded in the substrate in a desired wiring pattern, and includes the conductor exposure window 26 formed in the third substrate portion 22'c whereat the busbars 23 are exposed, the auxiliary-guiding and -fixing portion 27 extending at the lower end of the third substrate portion 22'c, and the above-mentioned internal unit locking elements 50.

The internal unit 25'a includes a base plate 25'b, various electric and electronic components implemented on one surface of the base plate 25'b, and the connector 25c (FIG. 8) provided on the other surface of the base plate 25'b toward the third substrate portion 22'c for electrical connection to the busbars 23. The connector 25'c has the number of resilient contact pieces 25'b (FIG. 8) corresponding to that of the busbars 23.

Figure 8:
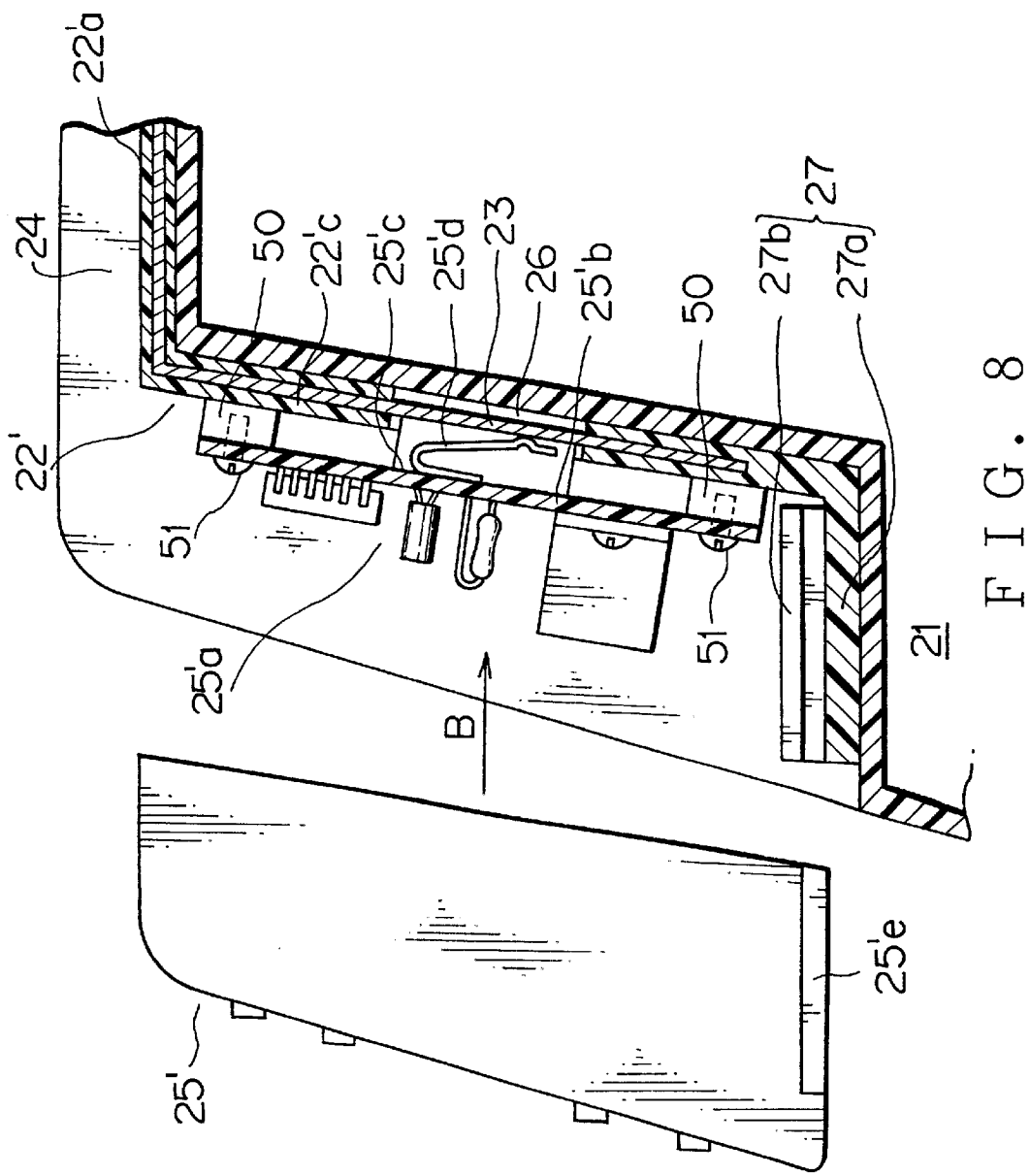
FIG. 8 is a longitudinal sectional view of the panel board of FIG. 7.

Referring to FIG. 8, denoted 25'e are rails (only one is shown) of substantially rectangular cross section slidable on the guides 27b, 27b to assemble the auxiliary 25' to the third substrate portion 22'c. It may be arranged that the auxiliary 25' and the internal unit 25'a are for example connector-connected to each other.

The busbars 23 are embedded in the panel board 22' at a substantially intermediate width thereof by insert molding. The conductor exposure window 26 and the auxiliary-guiding and -fixing portion 27 are the same in structure as those of the panel board 22 and their description is omitted.

The process of assembling the auxiliary 25' to the instrument panel 21 at the supplied will now be described with reference to FIG. 8.

In FIG. 8, the panel board 22' with the internal unit 25'a assembled thereto in advance is first mounted in the receiver space 24 of the instrument panel 21. The panel board 22' is provided at its rear surface with, for example, a not-shown adhesive tape and maintained in fixed position in the receiver space 24.

Thereafter, the auxiliary 25' is mounted. Because the auxiliary 25' substantially consists solely of a cover for the internal unit 25'a and weighs light, it is easily guided along the guiding and fixing portion 27 in the direction of the arrow B to be mounted on and connected to the internal unit 25'a.

The above circuit-wiring structure has, besides the same advantages as obtained with the panel board 22 described hereinabove, the following additional advantages.

Because the internal unit 25'a of the auxiliary 25' is assembled in advance to the panel board 22' with its connector 25'c electrically connected to the busbars 23 at the window 26, not only the mounting of the auxiliary 25' is facilitated, but also the panel board 22' is provided in module form incorporating an increased number of components as compared with the panel board 22, thereby leading to an improved workability at the supplied.

Another embodiment of a structure for wiring circuits on a panel of a vehicle body according to this invention will now be described with reference to FIG. 9.

Figure 9:
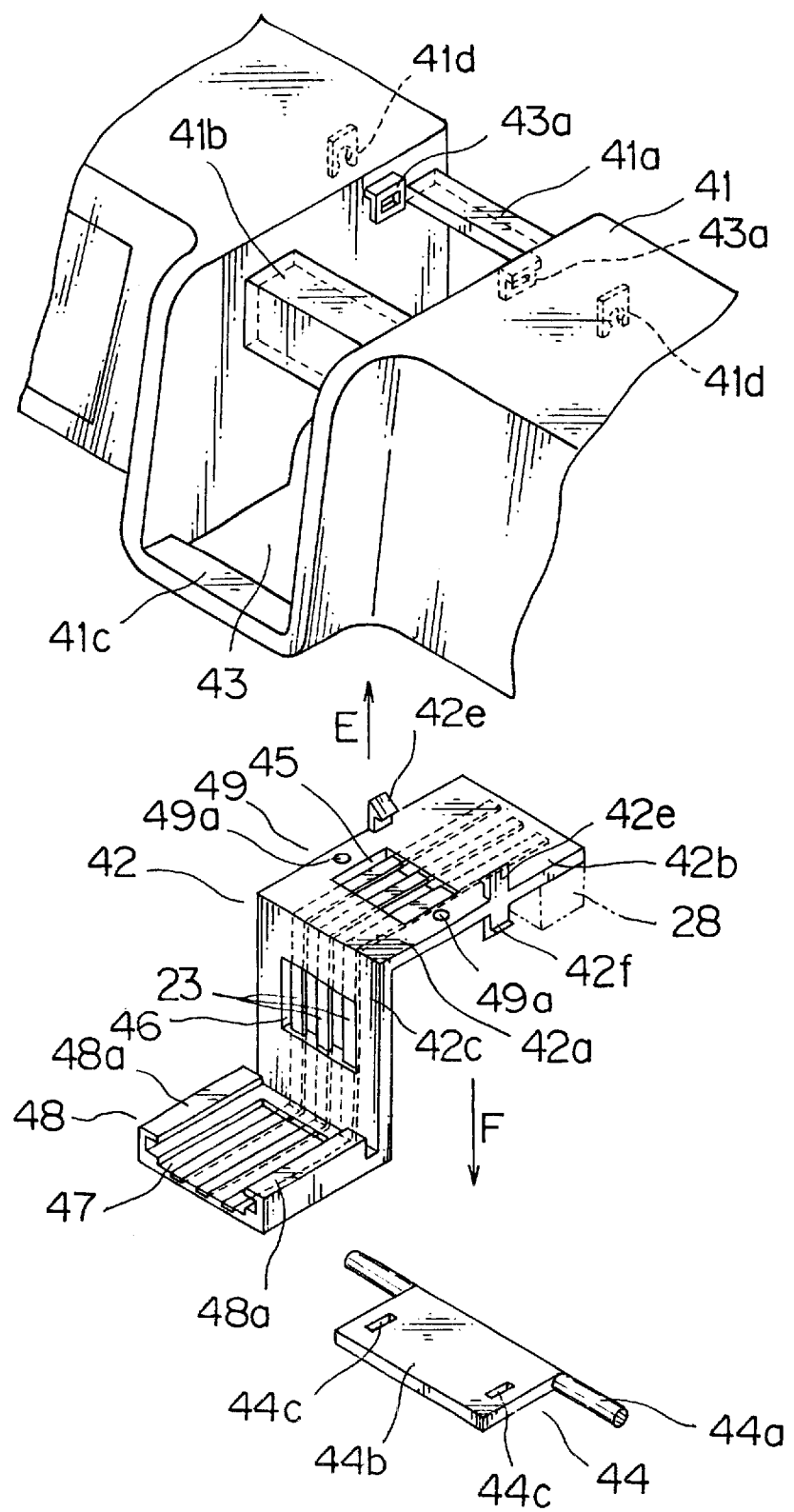
FIG. 9 is a perspective view of a structure for wiring circuits on a panel according to another embodiment of this invention.
Figure 10:
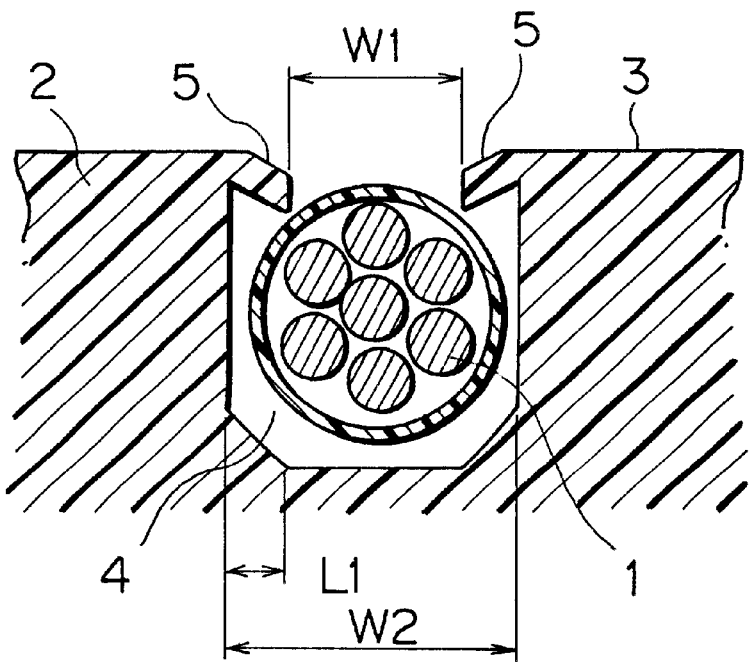
FIG. 10 is a sectional view of a conventional structure for wiring circuits on a panel.
Figure 11:
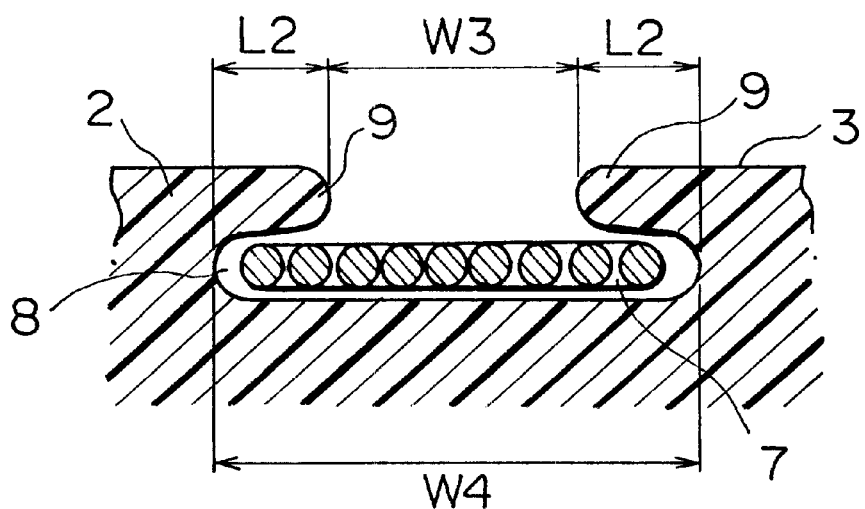
FIG. 11 is a sectional view of another conventional structure for wiring circuits on a panel.

In FIG. 9, denoted 41 is an instrument panel, and a separate panel board 42 with the plurality of busbars 23 thereon is mounted in a receiver space 43 of the instrument panel 41 to have the busbars 23 wired on the instrument panel 41.

This embodiment of the circuit-wiring structure. differs from the preceding embodiment of the circuit-wiring structure in that, the panel board 42 is fitted in the receiver space 43 from below as indicated by an arrow E and is fixed on a reinforcement member 44 for the instrument panel 41 to be mounted in the receiver space 43. After the panel board 42 has been mounted, a cover and an auxiliary (not shown) are fitted in the receiver space 43 as in the preceding embodiment to provide a normal appearance as an instrument panel.

The instrument panel 41 is a panel of synthetic resin molded by a large injection molding machine and has at a center thereof the receiver space 43 extending longitudinally of a not-shown vehicle (not limited to such configuration, though). Located inside the receiver space 43 are cross bars 41a to 41c of such shape as shown that link the left and right sides of the instrument panel 41, and the panel board 42 is arranged on the cross bars 41a to 41c. Provided on opposed inner walls of the receiver space 43 are locking elements 43a, 43a for the panel board 42. (The locking elements may be provided in a suitable number and at suitable positions.)

The panel board 42 consists of a synthetic resin plate of substantially constant width bent to correspond in shape to the receiver space 43 and the busbars 23 of conductive metal integrally embedded therein in a desired wiring pattern, and includes a first longitudinally-extending substrate portion 42a, a second longitudinally-extending substrate portion 42b continuous to one end of the first substrate portion 42a, a third substrate portion 42c bent downwardly at the other end of the first substrate portion 42a, and a guiding and fixing portion 48 for an auxiliary (not shown) extending longitudinally at the lower end of the third substrate portion 42c. The first and third substrate portions 42a, 42c and, in addition, the auxiliry-guiding and fixing portion 48 have respective conductor exposure windows 45, 46 and 47 whereat the busbars 23 are exposed. The first substrate portion 42a is provided with an auxiliary-guiding and -fixing means 49 comprised of a pair of locking holes 49a, 49a located at opposite sides thereof for engagement therein of not-shown pin members of the related auxiliary. (The position whereat to provide the locking holes 49a, 49a is not limited to the above.) The second substrate portion 42b is provided with a connector 28 for supplying power to the busbars 23 and the like. (The connector 28 may be provided in card edge form or the like.)

Further, the first substrate portion 42a has a pair of locking claws 42e, 42e and a pair of locking claws 42f, 42f projecting upwardly and downwardly, respectively, at opposite sides of the first substrate portion 42a, the locking claws 42e, 42e for locking engagement in the above-mentioned locking elements 43a, 43a and the locking claws 42f, 42f for locking engagement with the instrument panel reinforcement member 44. The locking claws 42e, 42e (their tip claw portions) and the locking claws 42f, 42f (their tip claw portions), although shown to face in opposite directions, are not limited to such arrangement insofar as capable of engaging in the locking elements 43a, 43a and with the reinforcement member 44, respectively.

The busbars 23 are embedded in the panel board 42 at a substantially intermediate width thereof by insert molding and also serve to reinforce the panel board 22 against distortion as in the preceding examples.

The conductor exposure windows 45, 46 are of rectangular shape and cut through the first and third substrate portions 42a and 42c, respectively, to have the busbars 23 exposed for direct contact and electrical connection with the auxiliary or auxiliaries 25. The conductor exposure window 47 is formed by recessing the guiding and fixing portion 48 to have only one surface of the busbars 23 exposed in card edge form for contact and electrical connection with a not-shown connector of the auxiliary 25.

The auxiliary-guiding and fixing portion 48 has guides 48a, 48a of substantially L-shaped cross section provided on both sides of the conductor exposure window 47, along which the auxiliary 25 is guided to slide on the guiding and fixing portion 48.

The instrument panel reinforcement member 44 consists of a round rod 44a for reinforcing the instrument panel 41 and a fixing plate 44b provided at an intermediate length of the round rod 44a. (The round rod 44a may be provided in an elongated plate and may be formed of synthetic resin or metal.) The round rod 44a is engageable in locking elements 41d, 41d located on the underside of the instrument panel 41. The fixing plate 44b is formed with locking holes 44c, 44c for locking engagement therein of the respective locking projections 42f, 42f of the panel board 42.

The not-shown auxiliary, like the auxiliary 25 in the example of FIGS. 1 and 2, is implemented with various switches, rails, pin members and the like and has a not-shown connector with resilient contact pieces for contact with the busbars exposed at the conductor exposure window 45, 46, 47.

The process of assembling the auxiliaries to the instrument panel 41 will now be described with reference to FIG. 9.

In FIG. 9, the.panel board 42 is first moved in the direction of an arrow F and fixed on the fixing plate 44b of the instrument panel reinforcement member 44. In other words, the locking projections 42f, 42f engage in the locking holes 44c, 44c to lock the panel board 42 and the reinforcement member 44 together.

The instrument panel reinforcement member 44 with the panel board 42 fixed thereon is then moved in the direction of an arrow E and mounted in the receiver space 43, with the panel board 42 in contact with the cross bars 41a, 41b, the lower end of its third substrate-portion 42c set on the cross bar 41c, and the round rod 44a of the reinforcement member 44 fitted in the locking elements 41d, 41d. The panel board 42 is locked in the receiver space 43 through the engagement of the locking claws 42e, 42e in the respective locking frames 43a, 43a.

The instrument panel 41 is given a sufficient strength by the reinforcement member 44, and the strength is not lowered by the provision of the panel board 42.

As described above in connection with FIG. 9, the circuit-wiring structure of this embodiment, like the circuit-wiring structure as described above which employs the panel board 22, facilitates the wiring of circuits on the instrument panel, imparts an improved configuration flexibility in designing the instrument panel, enables a reliable retention of the circuit-constituting conductors, and leads to an improved workability.

Having now fully described the invention, it will be apparent to one of ordinary skill in the art that many changes and modifications can be made thereto without departing from the spirit and scope of the invention as set forth herein.

What is claimed is:

1. A structure for wiring one or more circuits on a panel of a vehicle body, comprising:

a panel board having a first longitudinally-extending substrate portion, a second substrate portion extending perpendicularly at one end of the first substrate portion, and a third substrate portion extending downwardly at the other end of the first substrate portion, separate from said panel of the vehicle body, having one or more busbars insert molded in said panel board and laid in a desired wiring pattern, for constituting said one or more circuits and for providing reinforcement to said panel board to prevent distortion, said busbars being of sufficient cross-section to reinforce said panel board against distortion; and a receiver space provided in said panel of the vehicle body, complementary with the first, second and third substrate portions of the panel board, for receiving said panel board, wherein said panel board is mounted in said receiver space to wire said one or more circuits on said panel of the vehicle body, and said panel board is provided at opposite sides of the first substrate portion with a pair of guide pieces extending vertically in a fitting direction of said panel board in said receiver space and said panel of the vehicle body is provided inside said receiver space thereof with a pair of corresponding guide grooves for fitting engagement therein of said guide pieces.

2. The structure according to claim 1, wherein said panel board further has a rib extending longitudinally of said panel board for improving its stiffness.

3. The structure according to claim 1, wherein said panel board further has a plate adhered to or embedded in said panel board for improving its stiffness.

* * * * *